US010298233B2

(12) United States Patent
Neugart

(10) Patent No.: US 10,298,233 B2
(45) Date of Patent: May 21, 2019

(54) SWITCHING CONTROL ARRANGEMENT

(71) Applicant: Marquardt GmbH, Rietheim-Weilheim (DE)

(72) Inventor: Elmar Neugart, VS-Villingen (DE)

(73) Assignee: Marquardt GmbH, Rietheim-Weilheim (DE)

( * ) Notice: Subject to any disclaimer, the term of this patent is extended or adjusted under 35 U.S.C. 154(b) by 0 days.

(21) Appl. No.: 15/673,726

(22) Filed: Aug. 10, 2017

(65) Prior Publication Data
US 2017/0373687 A1 Dec. 28, 2017

Related U.S. Application Data

(63) Continuation of application No. PCT/EP2016/053304, filed on Feb. 17, 2016.

(30) Foreign Application Priority Data

Feb. 17, 2015 (DE) .......................... 10 2015 001 836
Feb. 17, 2015 (DE) .......................... 10 2015 001 838
Feb. 17, 2015 (DE) .......................... 10 2015 001 839

(51) Int. Cl.
*H01H 13/48* (2006.01)
*H03K 17/96* (2006.01)
(Continued)

(52) U.S. Cl.
CPC ........... *H03K 17/962* (2013.01); *H01H 3/122* (2013.01); *H01H 13/14* (2013.01); *H01H 13/52* (2013.01);
(Continued)

(58) Field of Classification Search
CPC ............. H01H 13/52; H01H 2003/008; H01H 2221/05; H01H 13/14; H01H 13/48; H03K 17/962
See application file for complete search history.

(56) References Cited

U.S. PATENT DOCUMENTS 5,714,980 A * 2/1998 Niino ..................... G05G 9/047
345/157
6,784,382 B2 8/2004 Yanai et al.
(Continued)

FOREIGN PATENT DOCUMENTS

DE 31 10 886 A1 9/1982
DE 82 14 479 U1 9/1982
(Continued)

OTHER PUBLICATIONS

English translation of International Preliminary Report on Patentability (Chapter I) (Application No. PCT/EP2016/053304) dated Aug. 31, 2017, 8 pages.
(Continued)

*Primary Examiner* — Felix O Figueroa
(74) *Attorney, Agent, or Firm* — Burr & Brown, PLLC

(57) ABSTRACT

A switching control arrangement, in particular for a motor vehicle, having a movable actuating surface that interacts with a displacement element in such a way that the actuating surface can be moved substantially linearly, over at least one distance, out of an initial position and into an actuating position. The displacement element has at least one elastic element arranged so as to be clamped in place. The actuating position can be designed as a switching position, such that the actuating surface, when in the switching position, has a switching effect on a switching element, a sensor, or the like. The elastic element is designed as a planar element with a small thickness in the form of a membrane, such that it is possible for the elastic element to be elastically deflected substantially perpendicularly to the surface of the membrane.

16 Claims, 17 Drawing Sheets

(51) Int. Cl.
  *H01H 13/52*  (2006.01)
  *H01H 3/12*  (2006.01)
  *H01H 13/14*  (2006.01)
  *G05G 1/02*  (2006.01)

(52) U.S. Cl.
  CPC ........... *H03K 17/9627* (2013.01); *G05G 1/02* (2013.01); *H01H 13/48* (2013.01)

(56) References Cited

U.S. PATENT DOCUMENTS

| | | | |
|---|---|---|---|
| 6,952,197 | B1 | 10/2005 | Nakamura et al. |
| 8,981,246 | B2 * | 3/2015 | Sano ................. H01H 13/14 200/246 |
| 8,981,247 | B2 * | 3/2015 | Sano ................. H01H 13/14 200/283 |
| 9,922,229 | B2 * | 3/2018 | Cao .................. G06K 9/00013 |
| 2004/0135767 | A1 | 7/2004 | Park |
| 2006/0185971 | A1 | 8/2006 | Rochon |
| 2007/0262954 | A1 | 11/2007 | Na et al. |
| 2012/0262256 | A1 | 10/2012 | Furukawa et al. |
| 2016/0163481 | A1 | 6/2016 | Neugart et al. |
| 2017/0045908 | A1 * | 2/2017 | Harms ................. B29D 19/00 |

FOREIGN PATENT DOCUMENTS

| | | |
|---|---|---|
| DE | 38 37 636 A1 | 5/1990 |
| DE | 20 2004 020 735 U1 | 5/2006 |
| DE | 20 2013 101 341 U1 | 7/2013 |
| DE | 10 2013 203 568 A1 | 7/2014 |
| DE | 10 2014 007 988 A1 | 12/2014 |
| EP | 2 485 112 A1 | 8/2012 |
| FR | 2 837 320 A1 | 9/2003 |
| JP | 2004-335383 A1 | 11/2004 |
| WO | 2013/020236 A1 | 2/2013 |
| WO | 2014/198418 A1 | 12/2014 |

OTHER PUBLICATIONS

German Search Report (Application No. 10 2015 001 836.1) dated Nov. 12, 2015.
German Search Report (Application No. 10 2015 001 838.8) dated Nov. 13, 2015.
German Search Report (Application No. 10 2015 001 839.6) dated Nov. 12, 2015.
International Search Report and Written Opinion (Application No. PCT/EP2016/053304) dated Jul. 6, 2016.

* cited by examiner

SWITCHING CONTROL ARRANGEMENT

CROSS REFERENCE TO RELATED APPLICATIONS

This application is a continuation of International Application No. PCT/EP2016/053304 filed Feb. 17, 2016, which designated the United States, and claims the benefit under 35 USC § 119(a)-(d) of German Application Nos. 10 2015 001 839.6, 10 2015 001 836.1 and 10 2015 001 838.8, all of which were filed Feb. 17, 2015, the entireties of which are incorporated herein by reference.

FIELD OF THE INVENTION

The present invention relates to a switching control arrangement.

BACKGROUND OF THE INVENTION

A switching control arrangement of this kind can be designed as a touchpad for controlling various functions, for example. In particular, the switching control arrangement can be used in a motor vehicle.

A switching control arrangement of this kind has a manually movable actuating surface for operation by the user. The actuating surface interacts with a displacement means, which has at least one elastic element arranged so as to be clamped in place, in such a way that the actuating surface can be moved substantially linearly, over at least one distance, out of an initial position or zero position and into an actuating position. The actuating position can be designed as a switching position, such that the actuating surface, when in the switching position, has a switching effect on a switching element, a sensor, or the like. In this case, a switching signal is produced which, in turn, can be used to trigger a correspondingly associated function. It has been found that tilting movements of the actuating surface can occur, especially if it is operated eccentrically by the user.

SUMMARY OF THE INVENTION

It is the underlying object of the present invention to develop the switching control arrangement in such a way that tilting movements of the actuating surface during operation by the user are largely avoided.

In the switching control arrangement according to the present invention, the elastic element is designed as a planar element with a small thickness in the form of a membrane, such that it is possible for the elastic element to be elastically deflected substantially perpendicularly to the surface of the membrane. In particular, the elastic element is designed in such a way that the thickness thereof is small in relation to the planar extent of the elastic element. Parallel guidance of the actuating surface during the movement thereof is advantageously achieved thereby, ensuring that tilting movements of the actuating surface are largely avoided.

The actuating surface can have a planar design, more specifically such that the actuating surface has a length in a first direction (x axis) and a width in a second direction (y axis). Moreover, the actuating surface can be moved linearly by a distance by means of the displacement element in a third direction (z axis), which, in particular, is substantially perpendicular to the first two directions (x and/or y axis). In this case, the actuating surface can be actuable with a small travel, more specifically in such a way that the length and/or width of the actuating surface in at least one of the first two directions (x and/or y axis) is greater than the distance for guidance by the displacement element for the mobility of the actuating surface in the third direction (z axis). In this case, the mobility of the actuating surface in the third direction (z axis) can advantageously be free from tilting relative to the first two directions (x and/or y axis).

In a conventional manner, a housing can be provided for the switching control arrangement. The actuating surface is preferably arranged on a surface of the housing which is manually accessible for the user after installation of the switching control arrangement in the motor vehicle. For the sake of ease of operation, the actuating surface can furthermore be movable in the direction of the interior of the housing. In a simple and low-cost embodiment, the actuating surface can interact with a frame and/or a spacer. One expedient possibility is for the actuating surface to be secured on the frame and/or on the spacer.

In another embodiment, the elastic element can be clamped on the frame and/or on the spacer. For this purpose, the frame can be connected to the spacer in a simple manner by means of the membrane. For the sake of precise guidance of the movement of the actuating surface, it can be appropriate, for the purpose of connecting the frame to the spacer, to provide two membranes arranged substantially parallel to one another, which are preferably arranged on mutually opposite sides of the frame and/or of the spacer.

In a preferred and functionally reliable embodiment, the frame can be arranged immovably in the housing. The spacer can be arranged movably in a receptacle in the frame, in particular in the form of a guide. For the purpose of precise guidance, it can be appropriate for the receptacle to be of approximately cross-shaped design and for the spacer to be of corresponding design to the receptacle.

In a simple and high-quality embodiment, the membrane can be secured on the frame and/or on the spacer, in particular, at the rim of the membrane, by welding, riveting, screwing, adhesive bonding, hot staking, clamping or the like. In a manner which is simple in terms of production, the welding can preferably be accomplished by means of ultrasonic welding, friction welding, laser welding or the like.

In an economical manner, the elastic element can be composed of a stiff plastic film and/or a thin plastic sheet. One expedient possibility is for the plastic film and/or the plastic sheet to be dimensioned in such a way that it has a stiffness such that there is substantially no deformation of the membrane when the actuating surface is unactuated, that is to say when there is no force being exerted by the user on the actuating surface. Polycarbonate, polyamide or similar thermoplastics can be used as plastics for the plastic film and/or the plastic sheet, for example. As an alternative, it is also possible for the membrane to be produced from a thin metal sheet, although plastic is preferred for this purpose owing to its low cost. One expedient possibility with a view to low cost is for the frame and/or the spacer likewise to be composed of plastic, in particular of polycarbonate, polyamide or the like. In a manner which is simple in terms of production, the frame and/or the spacer can be produced by means of injection molding.

The switching element, the sensor or the like can produce a signal on the basis of the switching action of the actuating surface in the switching position. This signal can then, in turn, be used to switch and/or trigger an associated function in the manner of a switching signal. In the case of a touchpad designed in accordance with the present invention as a switching control arrangement, it is then possible, for example, for a user to select a desired function in the motor vehicle by the user moving a finger on and/or over the actuating surface. The actuating surface is then moved by pressure by means of the finger on the actuating surface to produce the switching signal, as a result of which, in turn, the associated function is switched and/or triggered in the motor vehicle.

Finally, a passively operating and/or an actively operating element for resetting the actuating surface and/or for producing a haptic effect for the movement of the actuating surface can interact in a simple manner with the actuating surface. In a functionally reliable and yet low-cost way, the passively operating element can comprise a compression spring, a switch, a haptic mat or the like. In a likewise functionally reliable way, the actively operating element can comprise a piezoelectric element, a solenoid or the like.

The passively operating and/or actively operating element can interact with the spacer. In a preferred further embodiment, which is distinguished by particularly ergonomic controllability for the user, the passively operating and/or actively operating element can be arranged on a projection situated in the housing. The projection can project into a recess in the spacer. A boss facing the projection can furthermore be arranged on the actuating surface, such that the actuating surface interacts by means of the boss with the actively operating and/or passively operating element.

For a particularly preferred embodiment of the switching control arrangement according to the present invention, the following may be stated.

When actuating an operating element, the operating surface of which has a greater extent than the available guiding length required, a moment occurs in the event of an eccentric actuation. In the case of previous operating elements, this moment can cause such high frictional forces in the guides that jamming can occur.

The intention is therefore to implement an operating surface which is supported in such a way that, when actuated by the user, the surface can move linearly in the z direction. More specifically, no tilting of the operating surface should occur during this process. The tilt-free linear actuation should be provided independently of the selected actuating points. Moreover, the smallest possible overall depth should be the aim. The support for the operating surface should be free from backlash.

In the case of the operating element proposed, the reaction moment which arises in the case of eccentric actuation is absorbed by one and/or two elastically deformable elements, which are subjected to tension.

For this purpose, a frame is connected to a spacer by one and/or two thin, elastic surfaces. The connection is implemented by means of welding, riveting, screwing, adhesive bonding, hot staking, clamping or the like. The elastic surfaces are firmly connected both to the spacer and to the frame at a suitable point and thus a floating bearing is not necessary. There is sufficient free space between the frame and the spacer to prevent them from hindering each other during actuation. An operating surface of any desired type can be mounted both on the frame and on the spacer. If the frame or the spacer is used as a base, the spacer or the frame can be moved in the z direction by the action of a force at any point. In order to allow haptic feedback for the operator, a counterforce can be introduced at any desired position of the moving part by a passive element, e.g. a switch, a haptic mat or the like or by an active element, e.g. a piezoelectric element, a solenoid or the like.

An operating surface guided in parallel and having different haptic elements is thus created.

The advantages achieved by means of the present invention consist, in particular, in that the following are achieved:

parallel movement of the actuating or operating surface without tilting,
low-friction movement,
backlash-free support,
quiet actuation,
a small number of components,
low overall depth,
simplicity of production and very user-friendly assembly,
high flexibility in the haptic design and
high flexibility in the design of the actuating or operating surface.

BRIEF DESCRIPTION OF THE DRAWINGS

Illustrative embodiments of the present invention together with various developments and refinements are shown in the drawings and are described below in greater detail.

DETAILED DESCRIPTION OF THE INVENTION

Figure 1:
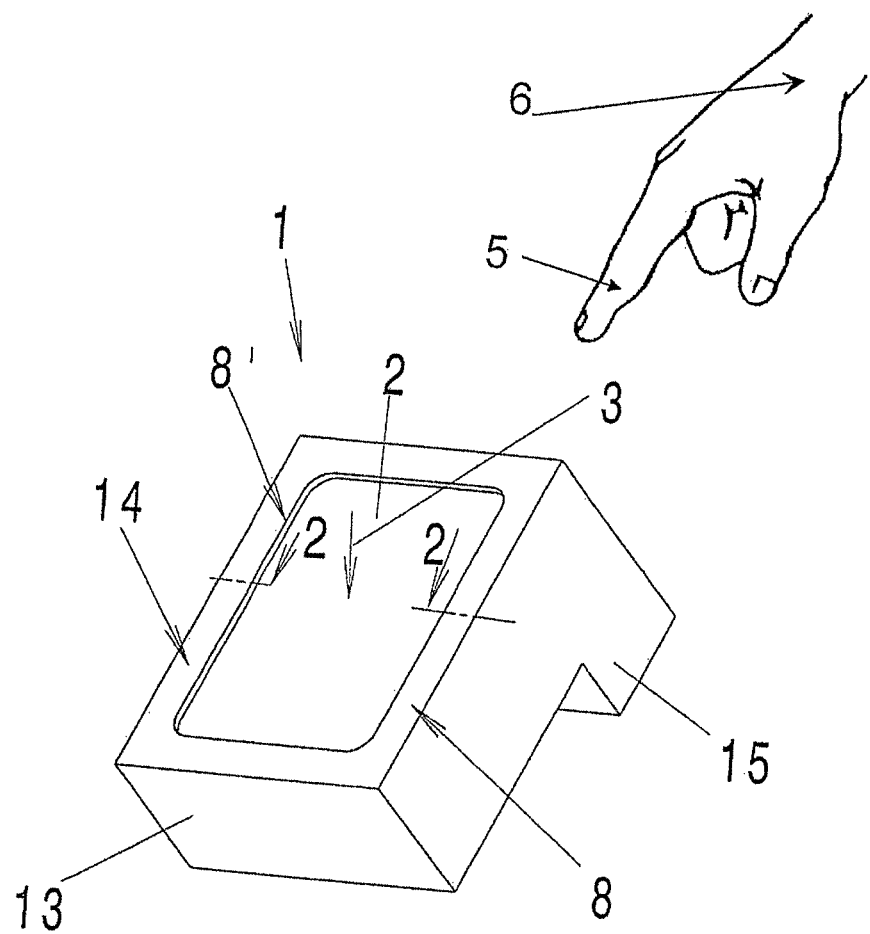
FIG. 1 shows a switching control arrangement in perspective view.

FIG. 1 shows a switching control arrangement 1 in the form of a touchpad, which is used, in particular, for a motor vehicle. The switching control arrangement 1 has a housing 13, which is composed of plastic and on one surface 14 of which, which is manually accessible, there is an actuating surface 2 or operating surface 2 extending in the x and y direction. The user can operate the switching control arrangement 1 in the intended manner by acting manually on the actuating surface 2 by means of an element 5. The element 5 can be the finger 5 of a human hand 6, operation as intended thus being made possible by means of appropriate movement of the finger 5. For example, the switching control arrangement 1 can be arranged in the center console of the motor vehicle and can be provided for control of a navigation system, a screen or the like in the motor vehicle. The switching control arrangement 1 can be connected to a bus system in the motor vehicle, for example, by means of a plug connection 15.

The switching control arrangement 1 is provided with a sensor (not shown specifically), which interacts with the actuating surface 2. The sensor, which operates capacitively and/or by infrared radiation, for example, produces a signal when the element 5, in this case, for example, the finger 5 of the hand 6 of the user, approaches the actuating surface 2 and/or when the actuating surface 2 is touched by means of the element 5 and/or when pressure is exerted on the actuating surface 2 by means of the element 5. The signal then serves to switch and/or trigger and/or select a function in the motor vehicle in the manner of a switching signal.

Figure 2:
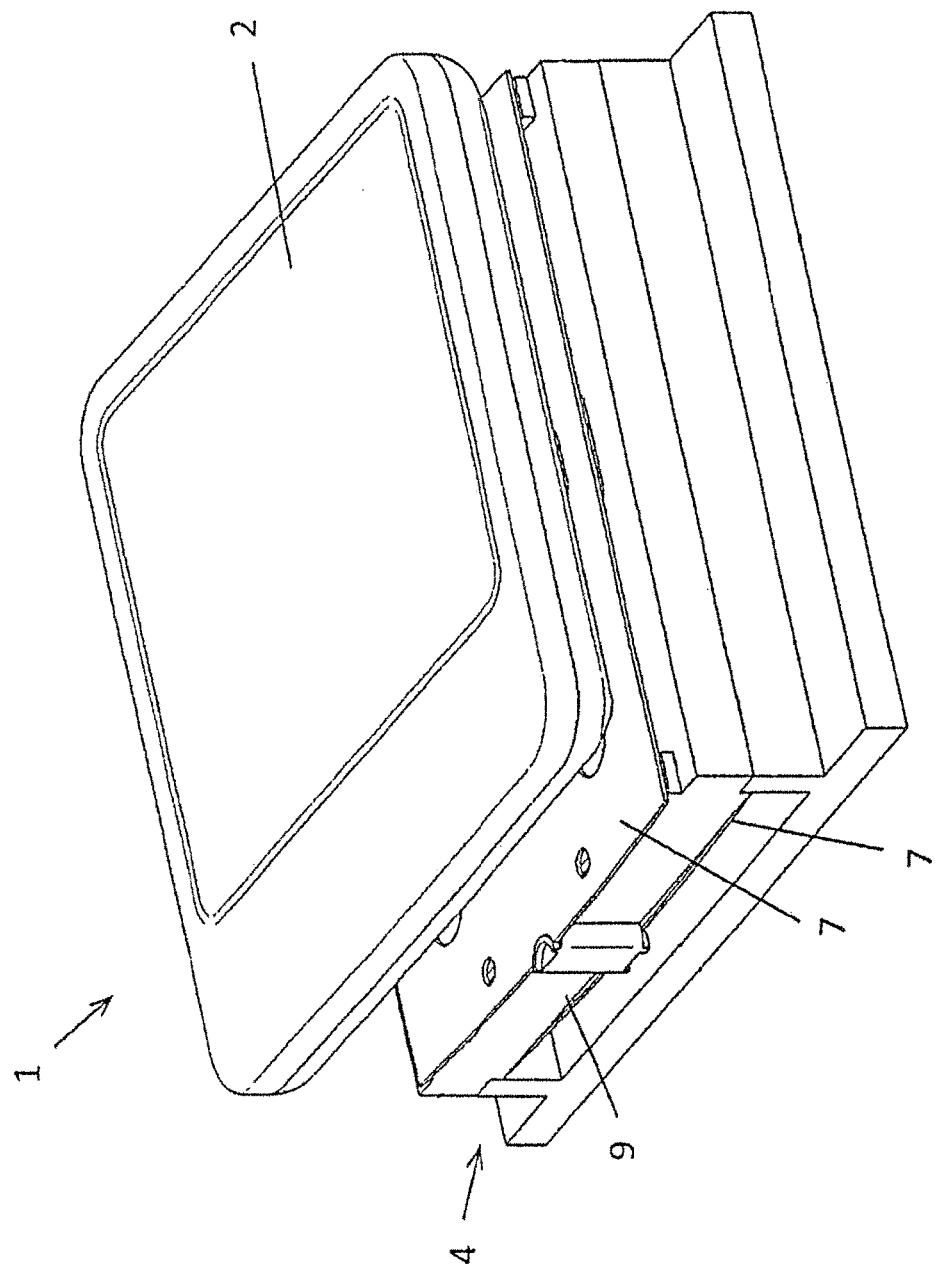
FIG. 2 shows the switching control arrangement from FIG. 1, wherein the housing has been removed.

The actuating surface 2 of the switching control arrangement 1 is furthermore designed to be movable in the direction 3 (z direction), allowing the actuating surface 2 to be moved manually by means of the finger 5 in direction 3 and thus in a direction toward the interior of the housing 13. For this purpose, the actuating surface 2 is designed with a small gap 8' with respect to the encircling rim region 8 of the housing 13. As can furthermore be seen in FIG. 2, the actuating surface 2 interacts for this purpose with a displacement element 4 in such a way that the actuating surface 2 can be moved substantially linearly, over at least one distance, out of an initial position or zero position and into an actuating position. The actuating position is designed as a switching position, such that the actuating surface 2, when in the switching position, has a switching effect on an electric switching element (not shown specifically). Here, the switching element produces a switching signal, which can serve as an "Enter" command and hence to switch and/or trigger the associated function in the motor vehicle, for example. Instead of an electric switching element, it is also possible for a sensor, e.g. a Hall-effect sensor, an inductive sensor, a photoelectric barrier or the like to be used.

Figure 4:
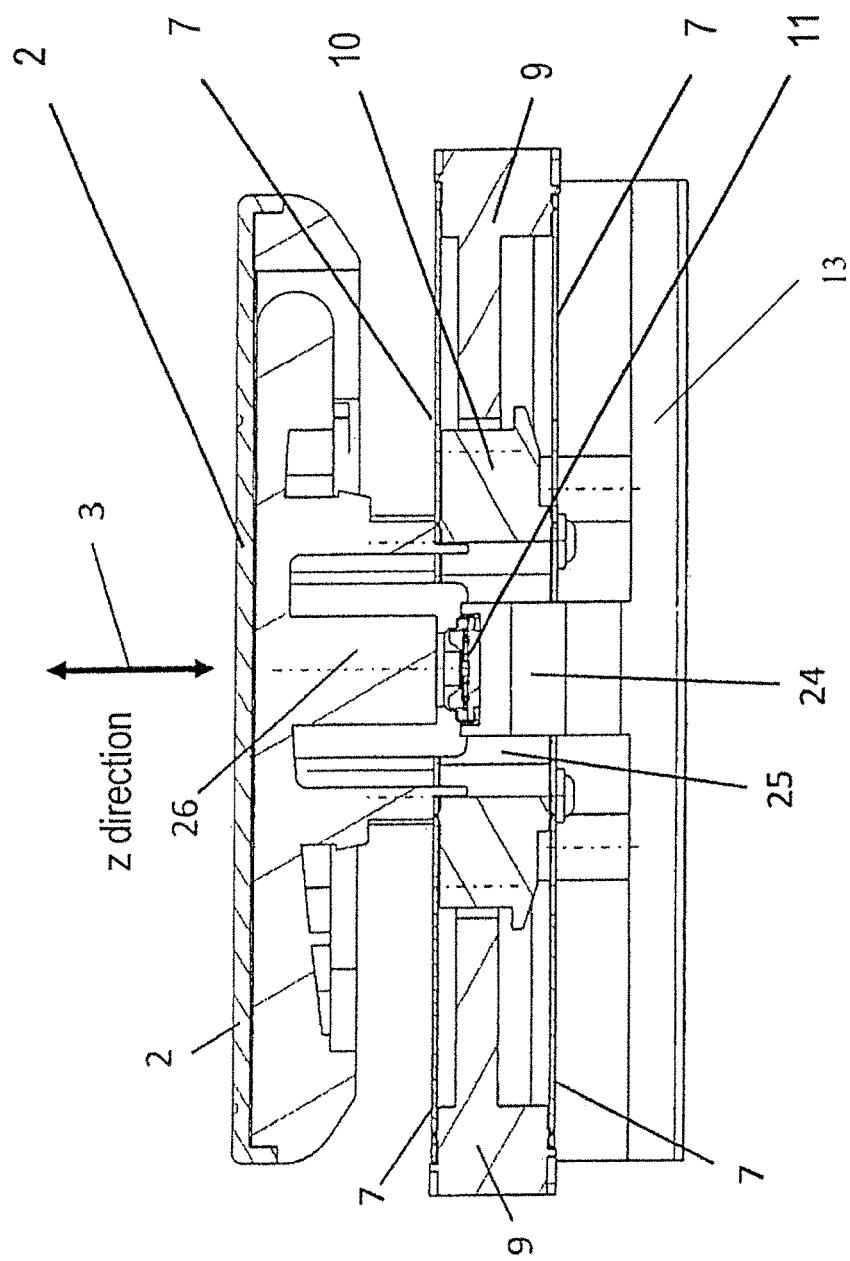
FIG. 4 shows a section along the line 2-2 in FIG. 1.
Figure 5:
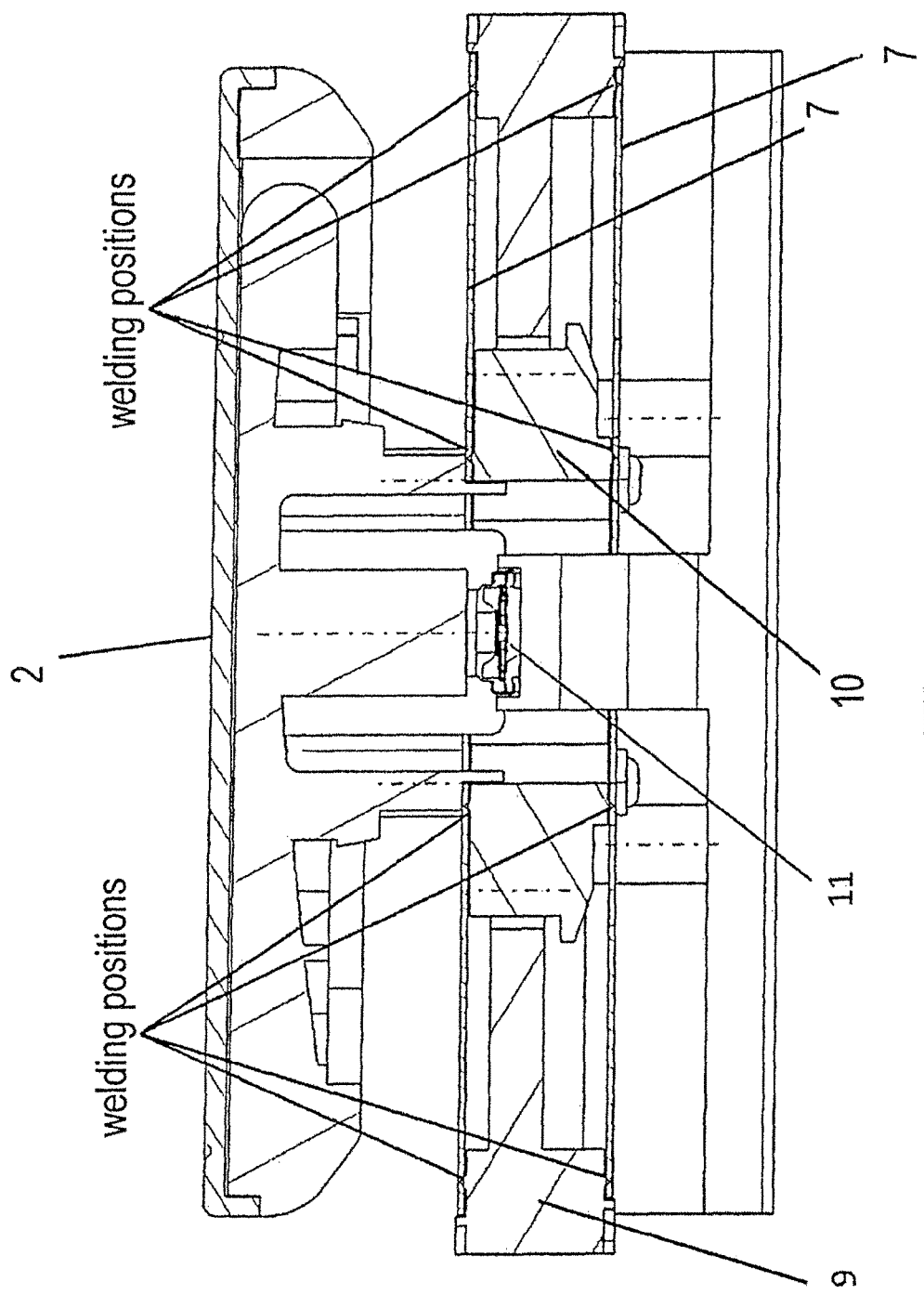
FIG. 5 shows a section like that in FIG. 4, wherein the fastening positions for the membrane are shown in detail.
Figure 6:
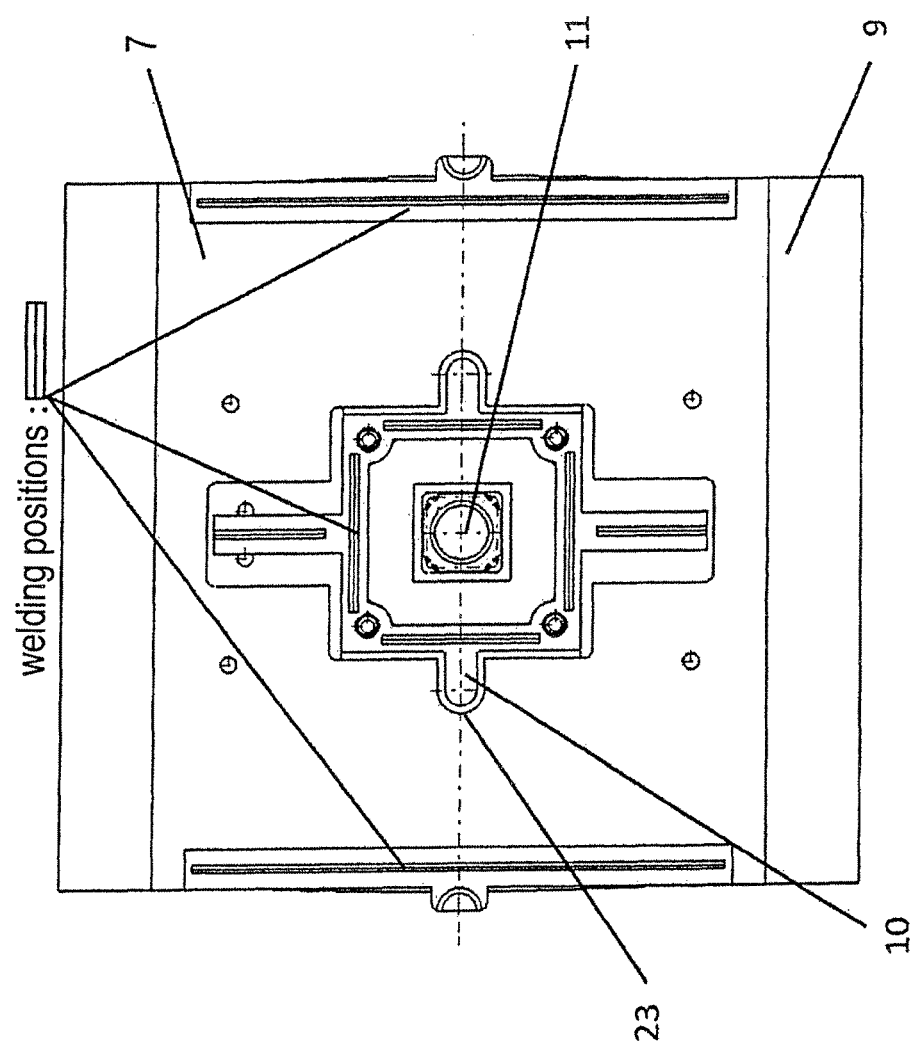
FIG. 6 shows a plan view of individual parts of the arrangement from FIG. 5.

The displacement element 4 has at least one elastic element 7 arranged so as to be clamped in place. As is more clearly apparent from FIG. 3, the elastic element 7 is designed as a planar element with a small thickness in the form of a membrane, such that it is possible for the elastic element 7 to be elastically deflected substantially perpendicularly to the surface of the membrane, i.e. in the z direction 3. "Small thickness" should be taken to mean, in particular, that the thickness of the elastic element 7 is small in relation to the planar extent thereof. The actuating surface 2 interacts with a frame 9 and/or a spacer 10. In the present case, the frame 9 is connected to the spacer 10 by means of the membrane 7, more specifically by means of two membranes 7 arranged substantially parallel to one another, which are arranged on mutually opposite sides of the frame 9 and/or of the spacer 10. In this case, the elastic element 7 is clamped in place on the frame 9 and/or on the spacer 10, as can be seen in FIG. 4. For this purpose, the membrane 7 is secured on the frame 9 and/or on the spacer 10 at the rim of the membrane by welding, wherein the welding positions are shown in detail in FIG. 5 or in FIG. 6. The welding can be accomplished by means of ultrasonic welding, friction welding, laser welding or the like. Instead of welding, the membrane 7 can also be secured by riveting, screwing, adhesive bonding, hot staking, clamping or the like.

Figure 3:
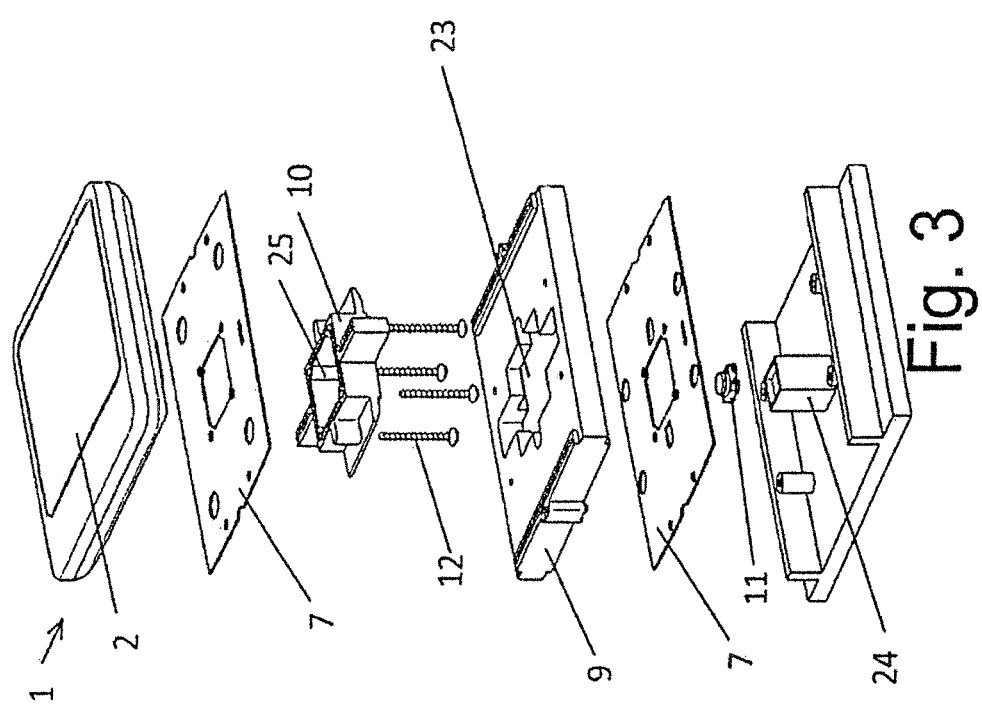
FIG. 3 shows an exploded view of the switching control arrangement from FIG. 2.
Figure 7:
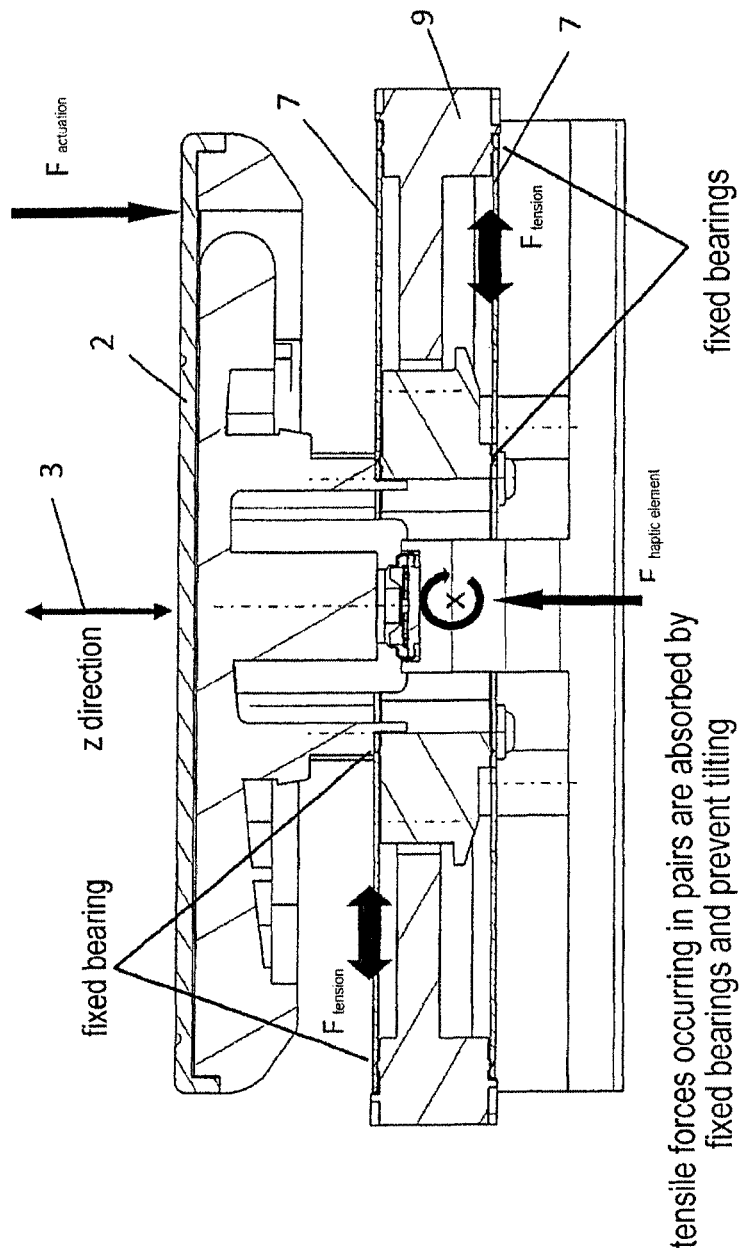
FIG. 7 shows a section like that in FIG. 5, wherein the absorption of the forces during actuation is shown in detail.

According to FIG. 3, the elastic element 7 is composed of a stiff plastic film and/or a thin plastic sheet. The plastic film and/or the plastic sheet is dimensioned with a stiffness such that it undergoes substantially no deformation when under no load. Elastic deflection of the plastic film and/or of the plastic sheet occurs only when there is a corresponding movement of the actuating surface 2 owing to operation by the user. During the elastic deflection of the membrane 7, tensile forces occurring in pairs are absorbed, as illustrated in detail in FIG. 7, and prevent tilting of the actuating surface 2.

The plastic for the plastic film and/or for the plastic sheet can be polycarbonate, polyamide or the like. The frame 9 and/or the spacer 10 can likewise be composed of plastic, e.g. of polycarbonate, polyamide or the like. The frame 9 and/or the spacer 10 are expediently produced by means of injection molding.

The frame 9 is arranged immovably in the housing 13, as can be seen from FIG. 4. According to FIG. 6, the spacer 10 is arranged movably in a receptacle 23 in the frame 9 in the form of a guide. In the present case, the receptacle 23 is of approximately cross-shaped design and the spacer 10 is of corresponding design to the receptacle 23. The actuating surface 2 is secured on the spacer 10 by means of screws 12, as can be seen in FIG. 3. Of course, it is also possible, reversing the action as it were, to secure the actuating surface 2 on the frame 9 instead of securing the actuating surface 2 on the spacer 10 and to arrange the spacer 10 immovably in the housing 13, although this is not shown specifically.

A passively operating and/or an actively operating element 11, shown in FIG. 3, for resetting the actuating surface 2 to the initial position and/or for producing a haptic effect for the movement of the actuating surface 2 into the actuating position can furthermore interact with the actuating surface 2. The passively operating element 11 can comprise a compression spring, a switch, a haptic mat or the like, and the actively operating element 11 can comprise a piezoelectric element, a solenoid or the like. The passively operating and/or actively operating element 11 is arranged on a projection 24 situated in the housing 13, more specifically on a base plate of the housing 13. As can furthermore be seen in FIG. 4, the projection 24 projects into a recess 25 in the spacer 10. A boss 26 facing the projection 24 is furthermore arranged on the actuating surface 2. During movement thereof, the actuating surface 2 then interacts by means of the boss 26 with the actively operating and/or passively operating element 11. Of course, the element 11 can also interact directly with the spacer 10, although this is not shown specifically.

In summary, it can thus be stated that the actuating surface 2 of the switching control arrangement 1 has a planar design with a length in a first direction (e.g. the x axis) and with a width in a second direction (e.g. the y axis). The actuating surface 2 can be moved linearly by a distance by means of the displacement means 4 in a third direction (e.g. the z axis), which is substantially perpendicular to the first two directions (x and/or y axis). Here, the length and/or width of the actuating surface 2 in at least one of the first two directions (x and/or y axis) is greater than the distance for guidance by the displacement means 4 for the mobility of the actuating surface 2 in the third direction (z axis). By virtue of the described embodiment of the displacement element 4, the mobility of the actuating surface 2 in the third direction (z axis) is free from tilting relative to the first two directions (x and/or y axis).

Figure 8:
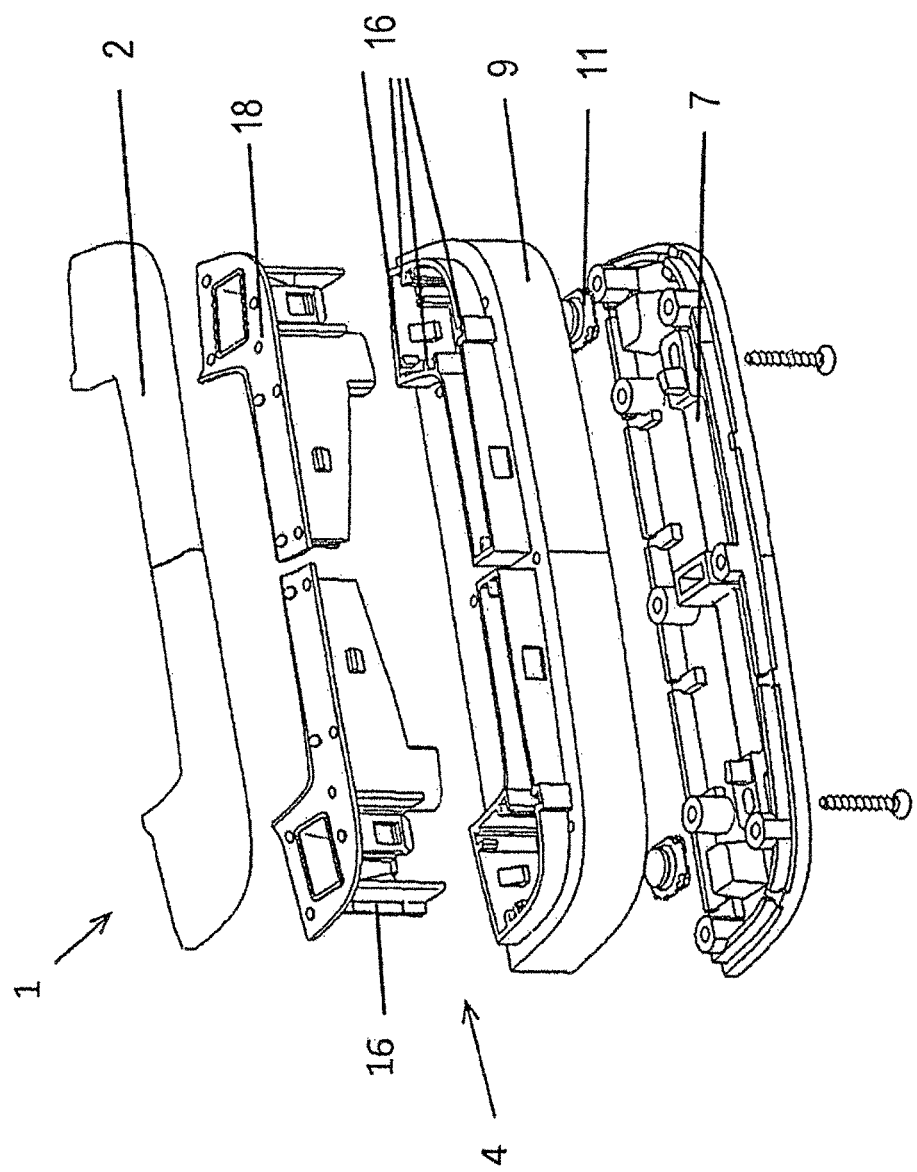
FIG. 8 shows another switching control arrangement in exploded view.
Figure 9:
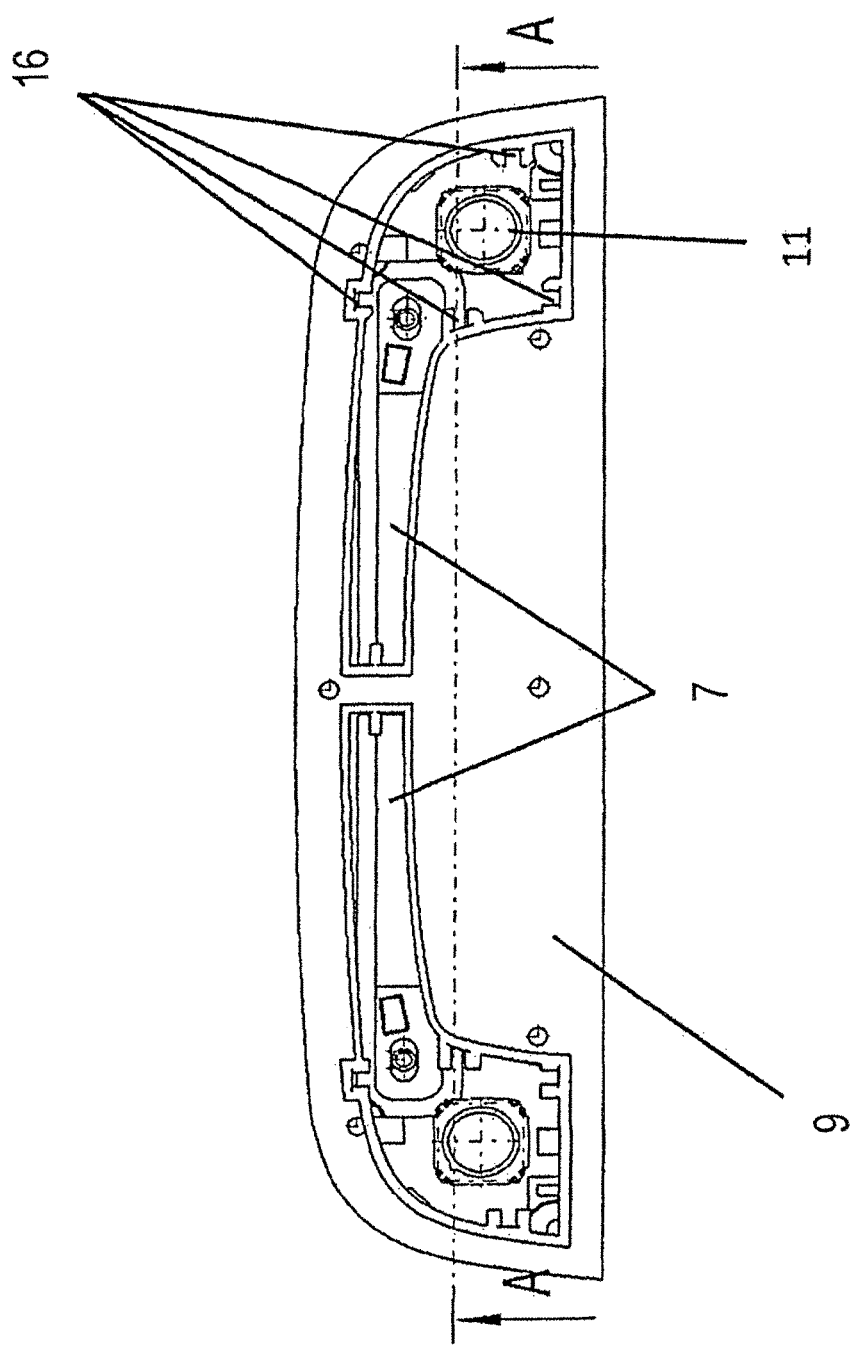
FIG. 9 shows the plan view of the arrangement shown in FIG. 8.
Figure 10:
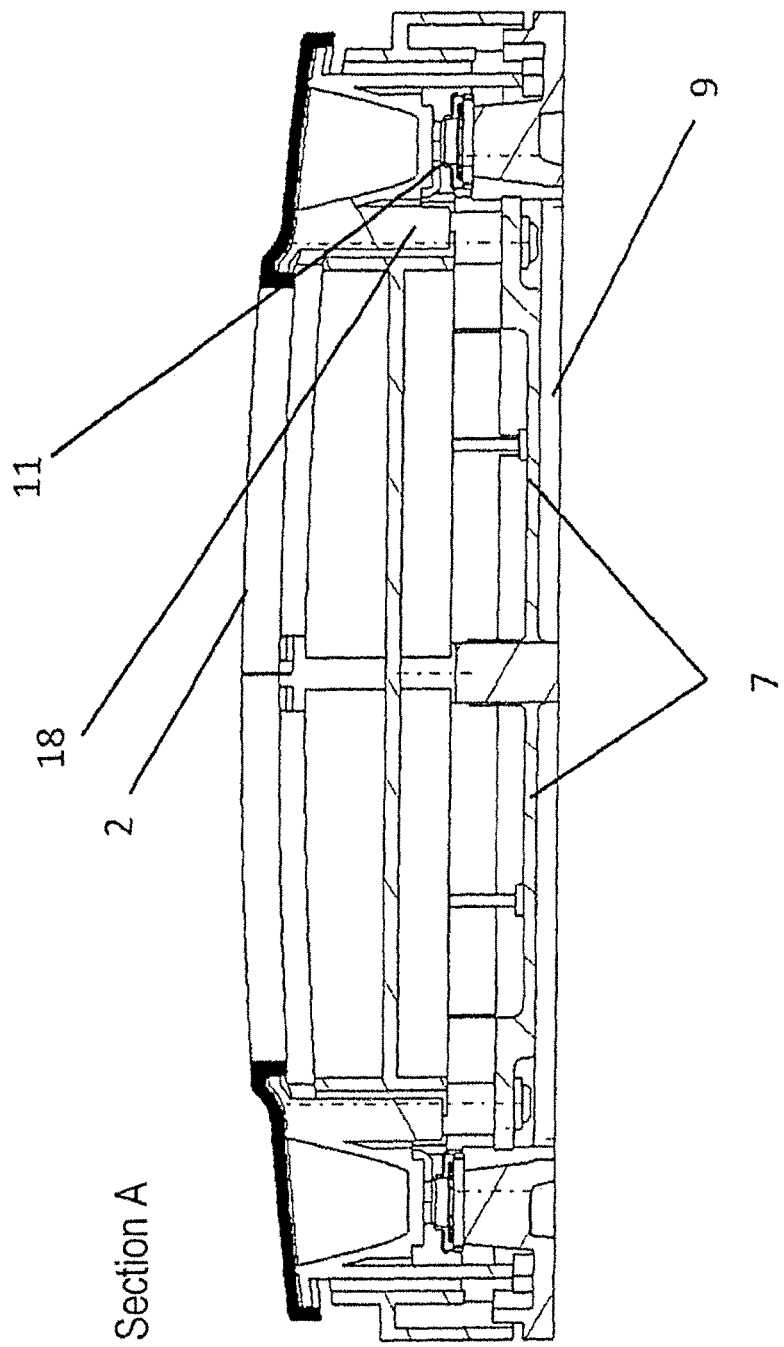
FIG. 10 shows a section along the line A-A through the arrangement shown in FIG. 9.

Another illustrative embodiment of a switching control arrangement 1 can be seen in FIGS. 8 to 10. This switching control arrangement 1 once again has an elastic element designed as a planar element with a small thickness in the form of a membrane 7. In addition, the displacement element 4 comprises a tongue and groove guide 16 for precise guidance of the actuating surface 2 during the actuation thereof. The actuating surface 2 acts on an actuator 18 of two-part design, thus allowing two switching signals to be produced in accordance with the respective actuation.

Figure 11:
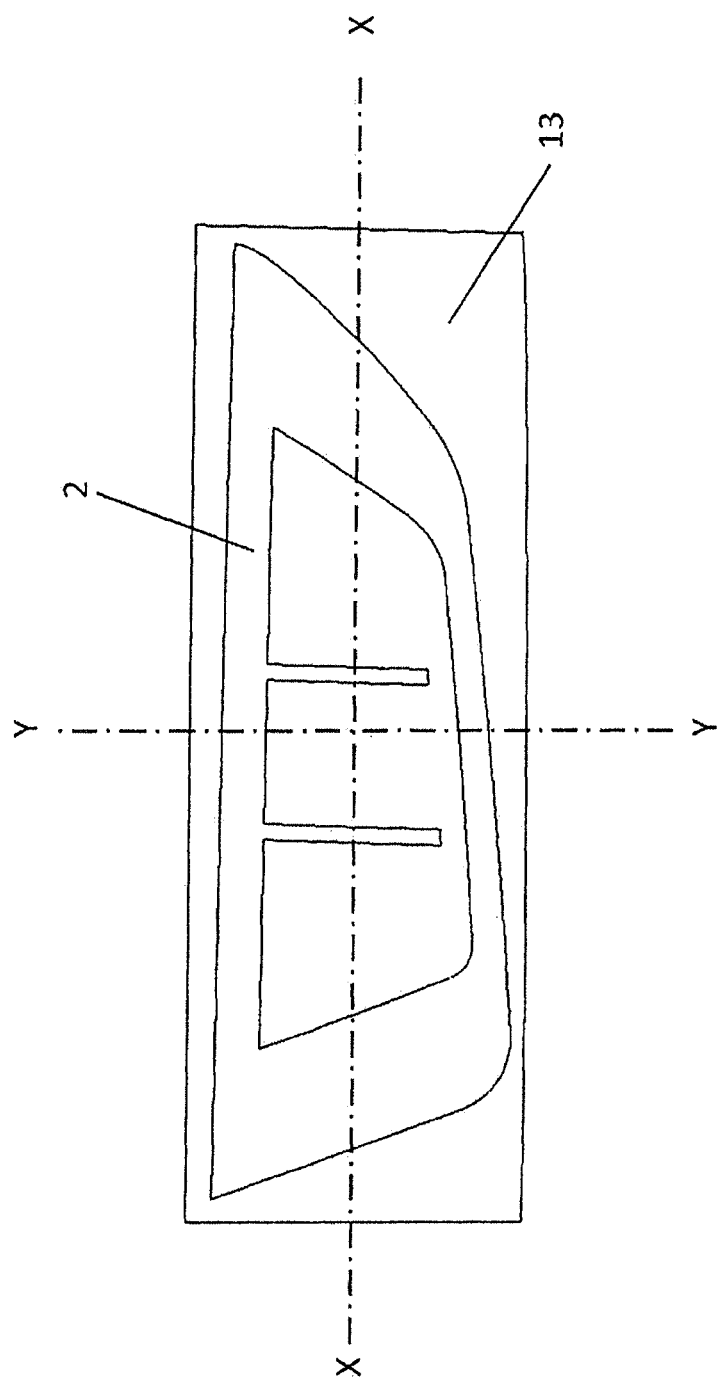
FIG. 11 shows the plan view of the switching control arrangement according to another embodiment.
Figure 12:
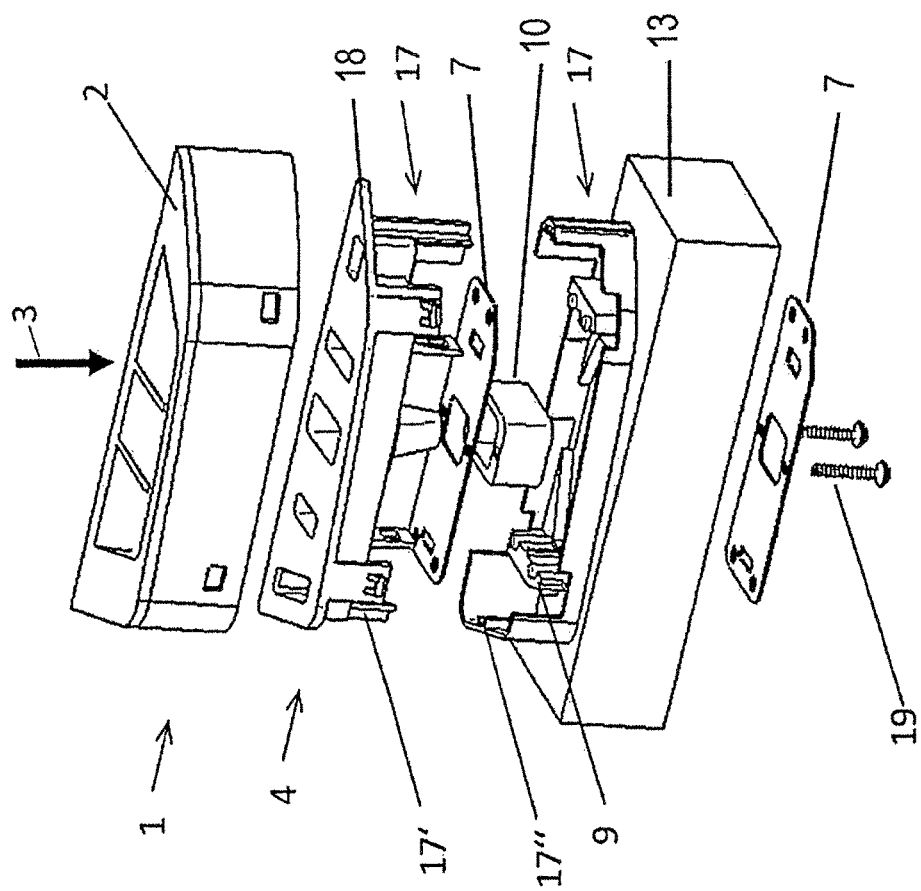
FIG. 12 shows the switching control arrangement from FIG. 11 in exploded view.
Figure 13:
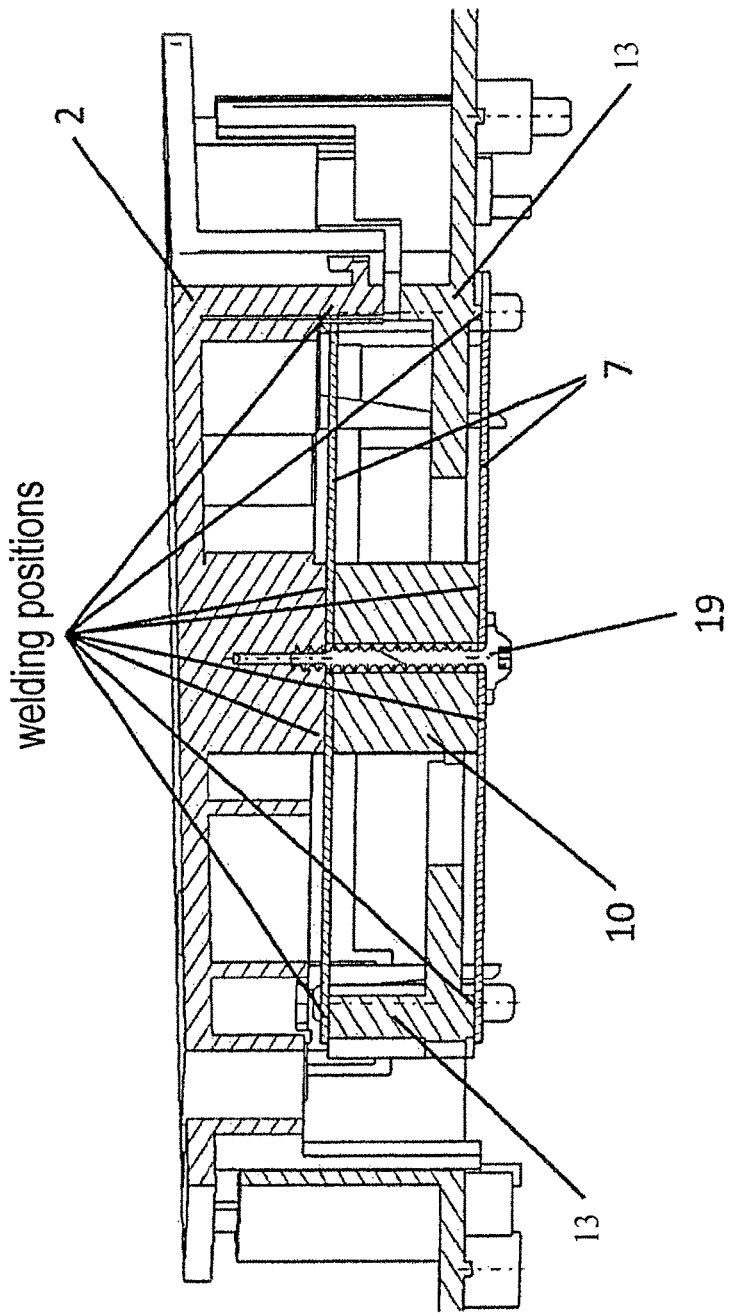
FIG. 13 shows a section through the switching control arrangement from FIG. 12.

As yet another illustrative embodiment, FIGS. 11 to 13 show a switching control arrangement 1 in the form of a short-stroke key. A switching control arrangement 1 of this kind can be used to advantage in a motor vehicle. The switching control arrangement 1 has a movable actuating surface 2 in the form of a cap, as is more clearly evident from FIG. 12. According to FIG. 11, the actuating surface 2 has an extent along a first axis x and along a second axis y, wherein the two axes x, y are perpendicular to one another. The actuating surface 2 interacts with a displacement element 4 in such a way that the actuating surface 2 can be moved substantially linearly in the direction of a third axis z, over at least one distance, out of an initial position and into an actuating position, wherein the third axis z is substantially perpendicular to the first and second axes x, y. The actuating position is designed as a switching position, such that the actuating surface 2, when in the switching position, has a switching effect on a switching element (not shown specifically), a sensor, or the like to produce a switching signal to switch and/or trigger a function. The displacement element 4 comprises a guiding means 17 for guiding the actuating surface 2 along and/or on the first axis x. The displacement element 4 furthermore comprises at least one elastic element 7, which is arranged so as to be clamped in place, for guiding the actuating surface 2 along and/or on the second axis y. As can be seen from FIG. 11, the extent of the actuating surface 2 along the first axis x is greater than that along the second axis y. Of course, it is also possible conversely for the extent of the actuating surface 2 along the first axis x to be less than that along the second axis y, although this is not shown specifically. The length and/or the width of the actuating surface 2 along at least one of the first two axes x and/or y is, in turn, greater than the distance for guidance by the displacement element 4 for the mobility of the actuating surface 2 in the direction of the third axis z. Here, the mobility of the actuating surface 2 in the direction of the third axis z is free from tilting relative to the first two axes x and/or y.

The elastic element 7 is designed as a planar element with a small thickness in the form of a membrane, such that it is possible for the elastic element 7 to be elastically deflected substantially perpendicularly to the surface of the membrane. The displacement element 4 comprises an actuator 18, wherein the actuator 18 interacts with a frame 9 and/or a spacer 10. The frame 9 is connected to the spacer 10 by means of the membrane 7, in the present case by means of two membranes 7 arranged substantially parallel to one another on mutually opposite sides of the frame 9 and/or of the spacer 10. The spacer 10 is once again secured on the actuator 18, more specifically by means of a screwed joint 19.

The guiding means 17 comprises a guide rib 17' and a groove 17" interacting with the guide rib 17'. One component 17' of the guiding means 17 is provided on the actuator 18, and the other component 17" of the guiding means 17 is provided on the frame 9. The elastic element 7 is once again composed of a stiff plastic film and/or of a thin plastic sheet, wherein the elastic element 7 is secured on the frame 9 and/or on the spacer 10 so as to be clamped in place. It can be secured by means of welding, adhesive bonding, riveting or the like, wherein the welding positions envisaged are indicated in FIG. 13.

The actuating surface 2 in the form of a cap is mounted on the actuator 18. Moreover, a housing 13 for the switching control arrangement 1 is provided. In this case, the actuating surface 2 is arranged on one side of the housing 13 and can be moved in the direction 3 of the housing 13.

Yet another embodiment of a switching control arrangement 1 having a housing 13, which is used, in particular, in a motor vehicle, is shown in FIG. 14 to FIG. 17. The switching control arrangement 1 has an actuating surface 2, which is arranged on one side of the housing 13, can be moved in the direction of the housing 13 and is designed in the form of an operating plate according to FIG. 14. As can furthermore be seen from FIG. 15, the actuating surface 2 interacts with a displacement element 4 in such a way that the actuating surface 2 can be moved substantially linearly, over at least one distance, out of an initial position and into an actuating position. The actuating position is designed as a switching position, such that the actuating surface 2, when in the switching position, has a switching effect on a switching element (not shown specifically), a sensor, or the like to produce a switching signal to switch and/or trigger a function.

Figure 16:
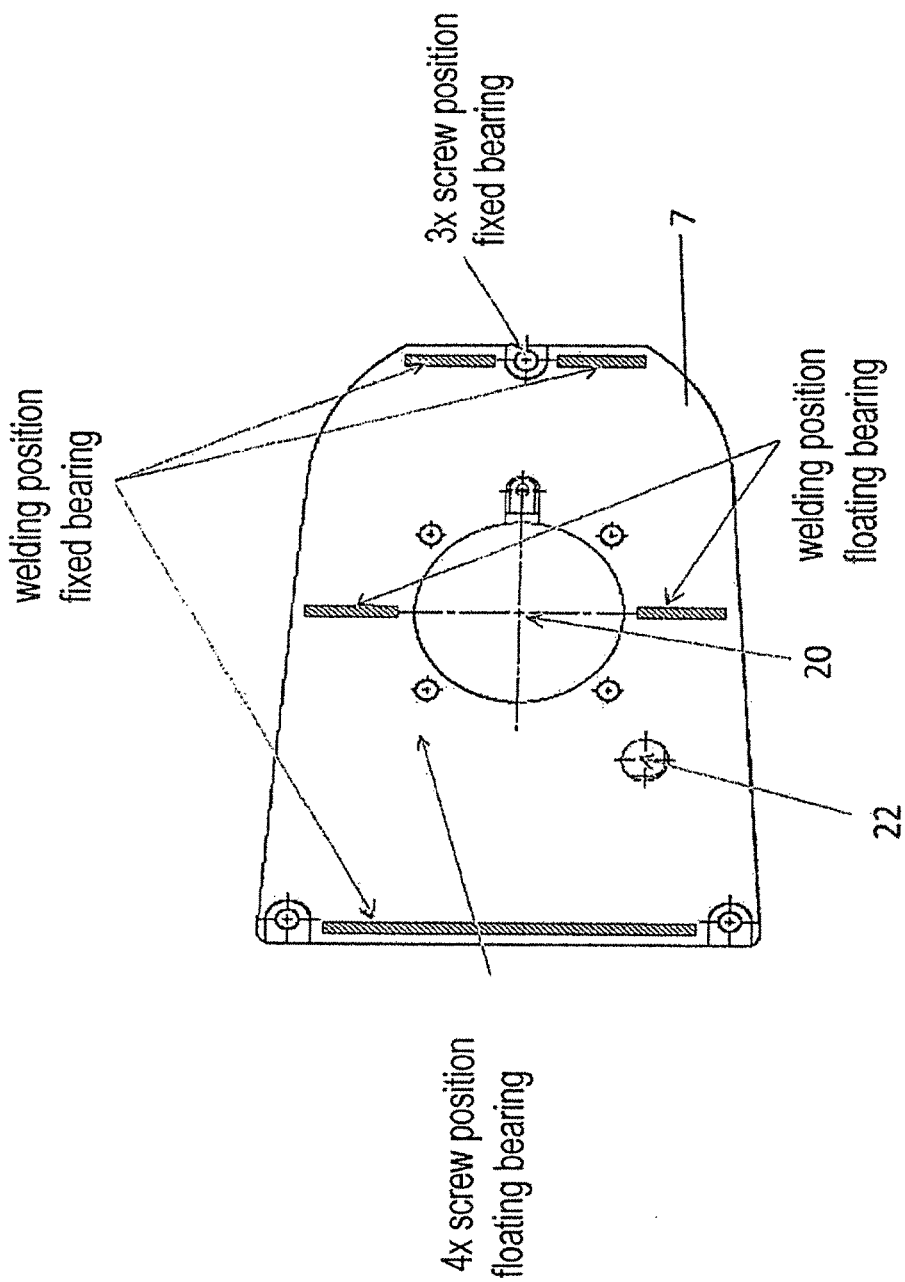
FIG. 16 shows an individual part from FIG. 15.
Figure 17:
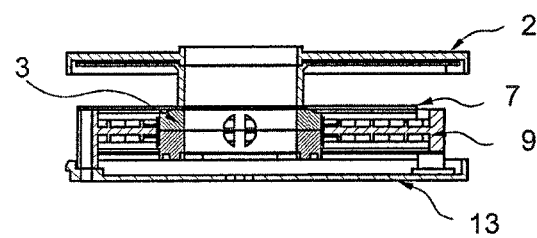
FIG. 17A shows the plan view of the switching control arrangement from FIG. 14.
FIG. 17B is a cross-sectional view along the line E-E shown in FIG. 17A.
FIG. 17C is a cross-sectional view along the line F-F shown in FIG. 17A.
Figure 17:
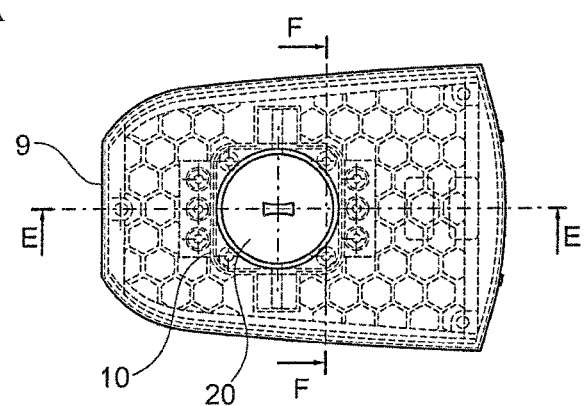
Figure 17:
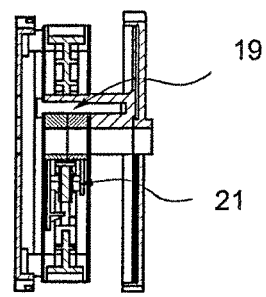

The actuating surface 2 is of asymmetrical design in one direction, more specifically being approximately double-wedge-shaped, as can be seen, for example, from FIG. 16. Here, the actuating surface 2 has a maximum length in a first direction (x) and a maximum width in a second direction (y). Once again, the actuating surface 2 can be moved linearly by a distance by means of the displacement element 4 in a third direction (z), which is substantially perpendicular to the first two directions (x and/or y). In this case, the maximum length and/or the maximum width of the actuating surface 2 in at least one of the first two directions (x and/or y) is once again greater than the distance for the mobility of the actuating surface 2 in the third direction (z). The design of the displacement element 4 has the effect that the mobility of the actuating surface 2 in the third direction (z) is free from tilting relative to the first two directions (x and/or y).

The displacement element 4 has at least one elastic element 7, which is arranged so as to be clamped in place. The displacement element 4 furthermore comprises a frame 9 and a guiding element 10. At least one part of the displacement element 4 is arranged eccentrically with respect to the actuating surface 2 in at least one direction, and this part is the guiding element 10, as can be seen from FIG. 15. The elastic element 7 is once again designed as a planar element with a small thickness in the form of a membrane, such that it is possible for the elastic element 7 to be elastically deflected substantially perpendicularly to the surface of the membrane. The frame 9 is connected to the guiding element 10 by means of the membrane 7, in the present case by means of two membranes 7 arranged substantially parallel to one another on mutually opposite sides of the frame 9 and/or of the guiding element 10. The elastic element 7 is furthermore composed of a stiff plastic film and/or a thin plastic sheet, wherein the elastic element 7 is secured on the frame 9 and/or on the guiding element 10 so as to be clamped in place. It can be secured by means of welding, adhesive bonding, riveting or the like, wherein the welding positions for the membrane 7 are shown in detail in FIG. 16.

Figure 14:
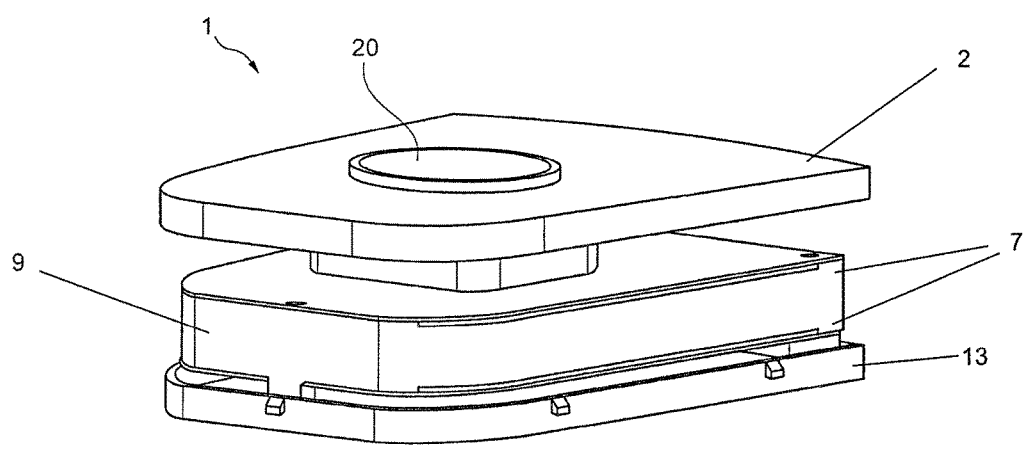
FIG. 14 shows a switching control arrangement in accordance with yet another illustrative embodiment in perspective view.
Figure 15:
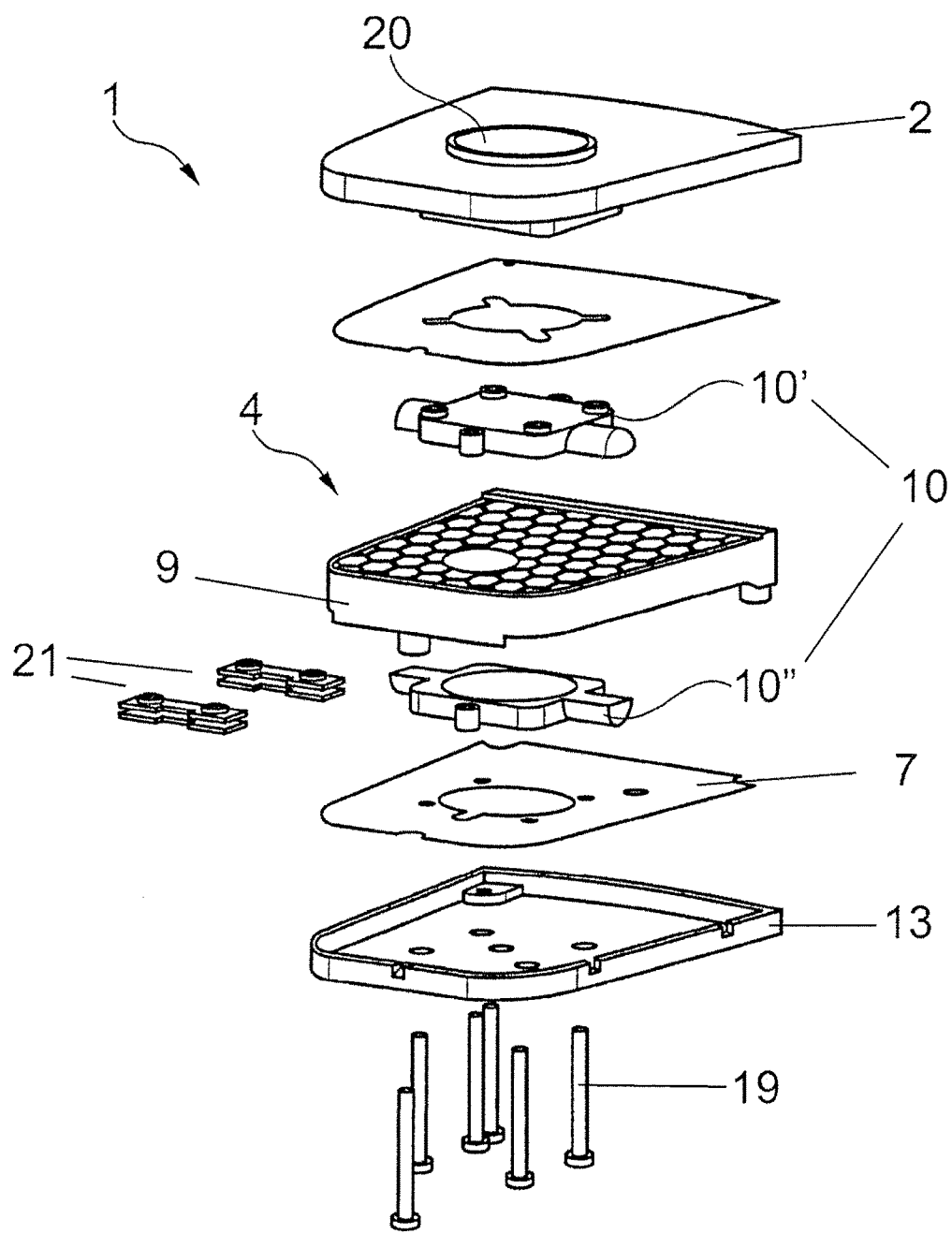
FIG. 15 shows the switching control arrangement from FIG. 14 in exploded view.

As can furthermore be seen from FIG. 17A, the guiding element 10 is positioned approximately centrally in the frame 9 in one direction. In the other direction, which is approximately perpendicular to the first direction, however, the guiding element 10 is positioned eccentrically in the frame 9. As shown in FIG. 14, there is an aperture 20 situated eccentrically in the actuating surface 2. A circular aperture 20 is arranged within the guiding element 10 so as to correspond thereto, and/or a circular aperture 20 is arranged in the elastic element 7 so as to correspond thereto, as can be seen from FIG. 16 and FIG. 17A. The guiding element 10 comprises two parts 10', 10", wherein damping elements 21 are arranged between the parts 10', 10" of the guiding element 10 and/or the frame 9, as can also be seen in FIG. 17A. The damping elements 21 damp a hard end stop of the actuating surface 2 during the actuation thereof and/or during the return thereof. The actuating surface 2 is secured on the guiding element 10 by means of a screwed joint 19.

Finally, a haptic element for resetting the actuating surface 2 and/or for producing a haptic effect for the movement of the actuating surface 2 interacts with the actuating surface 2. Here, the interaction with the actuating surface 2 can be accomplished, in particular, by means of the guiding element 10. The haptic element is arranged eccentrically with respect to the actuating surface 2, in the region of the guiding element 10. The eccentric position 22 for the haptic element is indicated in FIG. 16.

The present invention is not restricted to the illustrative embodiments described and shown. On the contrary, it also comprises all developments performed by a person skilled in the art within the scope of the invention defined by the patent claims. Thus, the switching control arrangement 1 according to the present invention can be used not only as a touchpad for motor vehicles but also for other switching elements with large-area operating surfaces and with linear actuation and possibly with short strokes. Moreover, the switching control arrangement 1 can also be used in household appliances, audio equipment, video equipment, telecommunications equipment or the like.

LIST OF REFERENCE SIGNS

1: switching control arrangement
2: actuating surface/operating surface
3: direction arrow
4: displacement element
5: finger
6: hand
7: elastic element/membrane
8: rim region (of housing)
8': gap (along the rim region)
9: frame
10: spacer/guiding element
10', 10": part (of guiding element)
11: passive/active element
12: screw
13: housing
14: surface
15: plug connection
16: tongue and groove guide
17: guiding means
17': guide rib
17": groove
18: actuator
19: screwed joint
20: aperture
21: damping element
22: position (for haptic element)
23: receptacle
24: projection
25: recess
26: boss

The invention claimed is:

1. A switching control arrangement having a movable actuating surface, wherein the actuating surface interacts with a displacement element such that the actuating surface can be moved substantially linearly, over at least one distance, out of an initial position and into an actuating position, wherein the displacement element has at least one elastic element arranged so as to be secured on the displacement element, and the actuating position is designed as a switching position, such that the actuating surface, when in the switching position, has a switching effect on one of a switching element and a sensor, wherein the elastic element is designed as a planar element having a surface and a thickness, such that the elastic element can be elastically deflected substantially perpendicularly to the surface of the elastic element, wherein
the actuating surface interacts with at least one of a frame and a spacer such that the actuating surface is secured on the at least one of the frame and the spacer,
the elastic element comprises two parallel elastic elements, which are arranged on mutually opposite sides of the at least one of the frame and the spacer, such that the frame is connected to the spacer by the two parallel elastic elements,
the frame is arranged immovably in a housing and the spacer is arranged movably in a receptacle in the frame such that the receptacle acts as a guide, and
the receptacle is of a cross-shaped design and the spacer has a design corresponding to the receptacle.

2. The switching control arrangement as claimed in claim 1, wherein the actuating surface has a length in a first direction and a width in a second direction, such that the actuating surface can be moved by means of the displacement element linearly by a distance in a third direction, which is substantially perpendicular to the first two directions, wherein one of the length and the width of the actuating surface in at least one of the first two directions is greater than a distance provided by the displacement element for guiding a mobility of the actuating surface in the third direction, such that the mobility of the actuating surface in the third direction is free from tilting relative to the first two directions.

3. The switching control arrangement as claimed in claim 1, wherein the actuating surface is arranged on a surface of the housing and can be moved in the direction of an interior of the housing.

4. The switching control arrangement as claimed in claim 3, wherein the two parallel elastic elements are secured on the at least one of the frame and the spacer.

5. The switching control arrangement as claimed in claim 3, wherein the two parallel elastic elements are secured on the at least one of the frame and the spacer at a rim of the two parallel elastic elements, by one of welding, riveting, screwing, adhesive bonding, hot staking, and clamping.

6. The switching control arrangement as claimed in claim 5, wherein the welding is accomplished by one of ultrasonic welding, friction welding, and laser welding.

7. The switching control arrangement as claimed in claim 5, wherein the at least one of the frame and the spacer comprises a plastic that is one of polycarbonate and polyamide.

8. The switching control arrangement as claimed in claim 7, wherein the at least one of the frame and the spacer is produced by means of injection molding.

9. The switching control arrangement as claimed in claim 3, wherein at least one of a passively operating element and an actively operating element is arranged on a projection provided in the housing in such a way that the projection projects into a recess in the spacer, and a boss facing the projection is arranged on the actuating surface, such that the actuating surface interacts by means of the boss with the at least one of the passively operating element and the actively operating element.

10. The switching control arrangement as claimed in claim 1, wherein the two parallel elastic elements comprise one of a stiff plastic film and a thin plastic sheet.

11. The switching control arrangement as claimed in claim 10, wherein the one of the stiff plastic film and the thin plastic sheet comprises a plastic that is one of polycarbonate and polyamide.

12. The switching control arrangement as claimed in claim 1, the one of the switching element and the sensor generates a signal on the basis of the switching effect of the actuating surface in the switching position, such that the signal serves to at least one of switch and trigger a function.

13. The switching control arrangement as claimed in claim 1, wherein at least one of a passively operating element and an actively operating element for one of resetting the actuating surface and for producing a haptic effect for a movement of the actuating surface is provided so as to interact with the actuating surface.

14. The switching control arrangement as claimed in claim 13, wherein the passively operating element comprises one of a compression spring, a switch and a haptic mat, and the actively operating element comprises one of a piezoelectric element and a solenoid.

15. The switching control arrangement as claimed in claim 1, wherein the switching control arrangement is for a motor vehicle.

16. The switching control arrangement as claimed in claim 1, wherein the thickness of each of the two parallel elastic elements is smaller than a planar extent of each of the two parallel elastic elements.

* * * * *